United States Patent [19]

van der Gaag

[11] 4,074,261

[45] Feb. 14, 1978

[54] KEYBOARD CONTACT AND SIGNAL LINE ARRANGEMENT

[75] Inventor: Hendrik van der Gaag, Eindhoven, Netherlands

[73] Assignee: U.S. Philips Corporation, New York, N.Y.

[21] Appl. No.: 573,477

[22] Filed: May 1, 1975

[30] Foreign Application Priority Data

May 6, 1974  Netherlands .......................... 7406034

[51] Int. Cl.² ................................................ G06F 3/02
[52] U.S. Cl. ............................ 340/365 R; 340/166 R
[58] Field of Search ............ 340/365 R, 365 S, 365 C, 340/166 R, 166 C; 178/DIG. 13; 179/18 GF; 358/191; 235/145 R, 146

[56] References Cited

U.S. PATENT DOCUMENTS

| 3,886,335 | 5/1975 | Hendricks ........................ 340/365 R |
| 3,950,743 | 4/1976 | Hatano et al. ................... 340/365 R |

OTHER PUBLICATIONS

"Memory Plane . . .", Constantine, IBM Technical Disclosure Bulletin, June 1960, p. 45.
"Memory Core . . .", Leightner et al., IBM Technical Disclosure Bulletin, Dec. 1962, p. 61.
"Crossover Balanced . . .", Councill et al., IBM Technical Disclosure Bulletin, Sept. 1963, p. 55.

Primary Examiner—John W. Caldwell, Sr.
Assistant Examiner—James J. Groody
Attorney, Agent, or Firm—Frank R. Trifari; Daniel R. McGlynn

[57] ABSTRACT

The invention relates to a keyboard comprising at least three contact points per key. One of a group of signal connections is always alternately connected to a group of keys. Each key is then alternately connected to one signal connection of said group. At least three of such groups are present so as to obtain a comparatively low value for the ratio of the number of signal connections to the number of keys.

4 Claims, 4 Drawing Figures

KEYBOARD CONTACT AND SIGNAL LINE ARRANGEMENT

The invention relates to a keyboard, comprising a number of contact points per key element, including a drive contact point, the contact points are coupled to each other by means of an actuated key and, the contact points of different key elements are selectively connected to each other by signal connection lines for the transport of a drive contact signal. A keyboard of this kind is known from U.S. Pat. No. 3,761,944. According to the Patent Specification, the keys are arranged in a two-dimensional matrix, a binary code combination which corresponds to the value of the key digit being produced on the respective signal connection lines when a key is actuated. In the case of a very large number of keys, the wiring pattern becomes very complex. If a contact fails, an incorrect code combination can be formed, which will be processed at a later stage as an erroneous character. Finally, the signal connection lines may be connected to different numbers of contact points, so that the lines have different impedances. These drawbacks are more significant for a keyboard comprising many keys.

The invention has for its object to realize a keyboard such that the signal connection lines have a regular lay-out. The invention also has for its object to realize an automatic detectability of failing contacts, without a redundant code having to be generated by additional contacts. The invention furthermore provides a keyboard having only few signal connection lines starting therefrom. The invention also provides a keyboard on which no electronic circuit elements need be provided. The invention finally provides a keyboard which can be easily operated and inexpensively manufactured.

These objects are realized in that the invention is characterized in that for at the most a predetermined number of correspondingly constructed key elements, the predetermined number being factorable into the product of three non-negative integers, $n$, $m$, and $p$, there are provided $n + m + p$ signal connection lines, each signal connection line of a group of $n$, $m$ and $p$ signal connections, respectively, being selectively connected to a corresponding contact point of at the most $m \times p$, at the most $n \times p$ and at the most $m \times n$ key elements, respectively, each key element being connected to a single signal connection line of each of the groups of $n$, $m$ and $p$ signal connection lines, respectively. A keyboard is known per se which comprises a single "make" contact per key and $j$ diodes per key, so that a $j$-out-of-$k$ code is formed. On the one hand, in this manner only a small number ($k$) of signal connections to the processing equipment is required. Moreover, an automatic code protection exists in that a failing contact means that only $j-1$ code signals occur. However, the diodes represent an additionl set of discrete, electronic components, and the addition thereof represents a substantial drawback, notably in a keyboard for bulk manufactured products. Products of this kind are, for example, pocket calculators and keyboards for remote control of apparatus, for example, for the channel selection of a television receiver. The diodes may be omitted, but the key elements then become complex due to the large number of contacts. Moreover, it is a major drawback of the formation of a $j$-out-of-$k$ code that a very complex pattern of connections arises which is not at all suitable to be composed of integrated components, for example, in the manner of printed wiring. Another solution could be the use of many key elements of different construction, but this increases the cost and the probability of manufacturing errors. It is a further drawback of the known keyboard that two keys may not be actuated simultaneously. The identity of each of the operated keys can only be individually determined if they do not have any of the $j$ elements in common. This will occur comparatively rarely.

A keyboard is known per se which comprises $m \times n$ keys, it being possible to couple two contacts per key by depression, there being $m + n$ signal connections in total. In that case for 32 keys at least $4 + 8 = 12$ signal connections are required. According to the invention, 12 signal connections are sufficient for $4 \times 4 \times 4 = 64$ keys, which represents a substantial extension. This is notably important, for example, when use is made of modular building bricks such as integrated circuits: the number of connection pins of such building bricks is often subject to a strict upper limit, for example, 16. A number thereof are reserved for supply leads, ground leads, and the like, so that the effective limit is even lower. The present invention offers a substantial improvement over the known technique.

The keyboard according to the invention preferably forms part of a series of $q$ keyboards which are arranged together, each key element comprises a contact point which is selectively connected to a single signal connection line of a further group of $q$ signal connection lines. The ratio of the number of keys to the number of signal connections is thus even further improved. In this manner, $3 \times 3 \times 3 \times 3 = 81$ keys can be used with 12 signal connections. This may be considered as a four-dimensional system. The invention also relates to five dimensional and higher dimensional keyboards.

When the keys are arranged in rows and columns, all keys of at least two rows preferably have one contact connected to one of the $m$ signal connections, all keys of at least two columns having one contact connected to one of said $n$ signal connections. Notably when always the same number of complete rows or the same number of complete columns is connected to each of the $m$ and $n$ signal connections, respectively, a keyboard having a simple, regular construction is obtained.

There is preferably also provided a driver device, $m$ outputs thereof being selectively connected to one of said $m$ signal connection lines and being separately, sequentially driven by an interrogation signal, per key each time one of the $m$ signal connections being connected to a drive contact point. Because the signals of the driver device appear successively, a handy synchronization and easy decoding of the signal code formed is possible.

The invention will be described in detail hereinafter with reference to a number of Figures.

Figure 1:
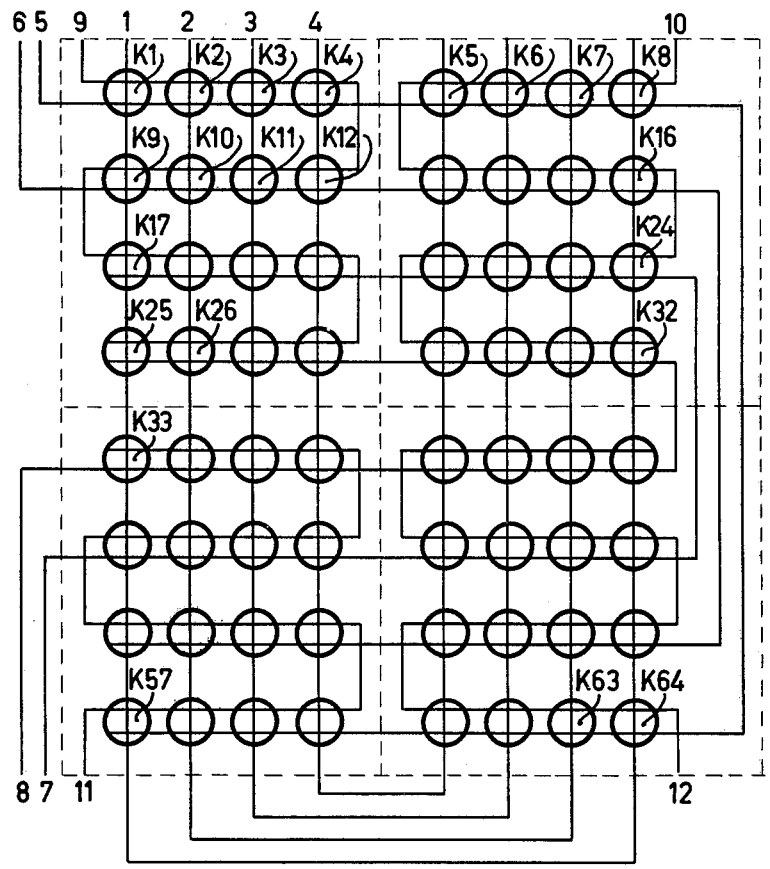
FIG. 1 shows a keyboard according to the invention.

FIG. 1 is a diagrammatic view of a keyboard comprising 64 keys, K1 ... 64; each key is diagrammatically represented by a circle. Each key has associated therewith three out of the total of twelve signal connections 1 ... 12. Key 1, for example, has associated therewith the signal connections 1, 5, 9, and key K16 has associated therewith, for example, the signal connections 1, 6, 10, etc. The keys may be of various different constructions. The coupling of the various contact points can be effected in a galvanic, capacitive or other manner. Furthermore, the actuation of a key may activate a make contact or a break contact. All sorts of key constructions are known per se, for example, from the article by S. Davis "Keyswitch and keyboard selection for computer peripherals," Computer Design, March 1973, page 67.

Figure 2:
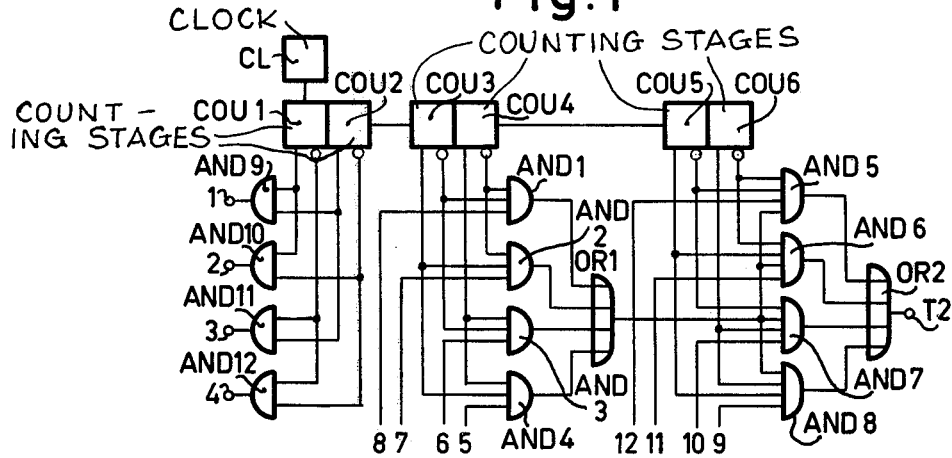
FIG. 2 shows an interrogation and decoding device for this keyboard.

FIG. 2 shows an interrogation and decoding device for a keyboard as shown in FIG. 1, comprising a clock C1, six binary counting stages COU 1 . . . 6, 12 logic AND-gates AND 1 . . . 12, two logic OR-gates OR1, OR2; 12 signal connections 1 . . . 12, and one output terminal T2. The twelve signal connections can be connected to correspondingly numbered signal connections of FIG. 1. The clock C1 applies a pulse to the binary counting stage COU 1 at at regular intervals. The six binary counting stages COU 1 . . . 6 constitute a 64-position counter which continuously circulates under the control of the clock. The logic AND-gates AND 9 . . . 12 act as a decoder for the counting stages COU 1, 2. The information for each binary counting stage is available on two outputs, in the non-inverted form as well as in the inverted form. The latter is denoted by an open circle. For example, if stage COU 1 is in the position "0" and stage COU 2 is, for example, in the position "1," the logic AND-gate AND 11 receives two "1" signals, so that the signal connection line 3 is interrogated. In this manner, continually one of the four signal connection line 1 . . . 4 is interrogated. Similarly, the logic AND-gates 1 . . . 4 each time receive two signals from the binary counting stages COU 3, 4, with the result that each time one of the four gates receives two logic "1" signals. Similarly, continually one of the four logic AND-gates AND 5 . . . 8 receives two logic "1" signals from the binary counting stages COU 5, 6.

Assume that key K16 is actuated. If the logic AND-gate AND 9 interrogates the signal connection 1, the contact point connected to this signal connection (the drive contact point) in the key element associated with key K16 is coupled to the contact points which are connected to the signal connections 6 and 10 in the key element. If the logic AND-gate AND 3 of the logic AND gates AND 1 . . . 4 receives two logic "1" signals from the binary conting stages COU 3, 4 this gate itself produces an interrogation signal. In other cases none of the logic AND gates AND 1 . . . 4 produces an interrogation signal. The interrogation signal of gate AND 3 passes the logic OR-gate OR 1 and thus interrogates all logic AND-gates AND 5 . . . 8. The logic AND-gate AND 7 of these AND-gates thus receives a further interrogation signal via the signal connection 10. If the logic AND-gates AND 7 of the logic AND-gates AND 5 . . . 8 receives two logic "1" signals from the binary counting stages COU 5, 6, this gate itself supplies an interrogation signal. In other cases none of the logic AND-gates AND 5 . . . 8 supplies an interrogation signal. The interrogation signal of gate AND 7 passes the logic OR-gate OR 2, and thus reaches the output terminal T2. During the counting of the counter COU 1 . . . 6 through the 64 positions, the identity of the actuated key is given by the instant at which the output pulse appears on terminal T2.

For given keyboards it is to be preferred that two keys can be simultaneously actuated. The described keyboard inter alia offers this possibility when the coupling of the signal connections in a key is such that the interrogation pulse (for example, on the line 1) is transmitted in an attenuated manner. To this end, the output lines of the logic AND-gates AND 9 . . . 12 may include matching amplifiers (not shown). The code of a first actuated key can then be stored in a memory. If a second key is then actuated and interrogated, each time a code combination other than for the first key is supplied. By comparison with the first code combination generated and by detection of the non-correspondence, the second code can be supplied to a user, for example, to a computer. The drive pulses are passed on in an attenuated manner by an actuated key. In that case, should a second key which is connected to the same signal connection be actuated, these pulses are still further attenuated. For example: key K16 is actuated, so that the signal connections 1, 6 and 10 are coupled. If key K10 is then also actuated, the signal connection 9 receives only a signal attenuated further. If the logic AND-gates AND 1 . . . 8 comprise discriminating input thresholds, they can be adjusted such that they are not actuated by the twice-attenuated signal. In given combinations more keys can be simultaneously depressed, without the risk of mix-ups. In other cases it is alternatively possible to keep a plurality of keys depressed simultaneously, while one actuated key forms a galvanic contact without attenuation.

Figure 3:
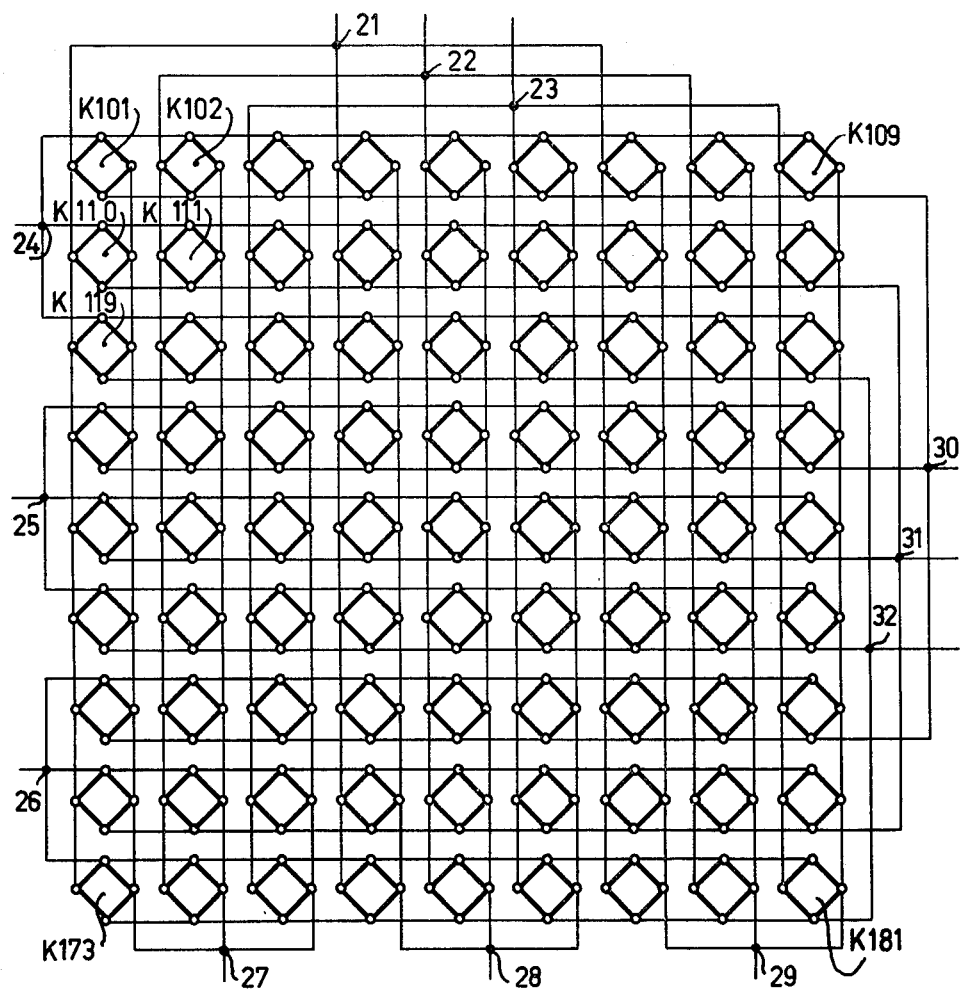
FIG. 3 shows a second keyboard according to the invention.

FIG. 3 is a diagrammatic representation of a second keyboard according to the invention, comprising 81 keys: K101 . . . 181, each of which is denoted by a square comprising the four contact points which are denoted by circles. One contact point of each key is connected to one of the three signal connections 21, 22, 23, a second contact point being connected to one of the three signal connections 24, 25, 26, a third contact point being connected to one of the three signal connections 27, 28, 29, and a fourth contact point being connected to one of the three signal connections 30, 31, 32. Each signal connection is thus connected to 27 key elements. The construction interrogation and decoding device can be similar to the one shown in FIG. 2, be it that per three signal connections decoding must be effected.

Another possibility exists in that, when a key is operated, all associated contact points are coupled to an additional contact which, for example, has a fixed potential and which is common to all keys. The following table states a few possibilities for the signal connections.

| Number of lines | Configuration | Maximum number of keys |
| --- | --- | --- |
| 10 | 3 × 3 × 4 | 36 |
| 12 | 3 × 4 × 5 | 60 |
| 12 | 4 × 4 × 4 | 64 (FIG. 1) |
| 12 | 3 × 3 × 3 × 3 | 81 (FIG. 3) |
| 16 | 4 × 4 × 4 × 4 | 256 |
| 16 | 3 × 3 × 3 × 3 × 4 | 324 |

It appears that the maximum number of keys which can be formed by means of a fixed number of lines can each time be realized by one-out-of-three codes. There are also other arguments, such as the number of contact points per key element and the construction of the interrogation and decoding circuit.

It is an additional advantage of a keyboard according to the invention that a failing contact of an operated key always leads to a failure to generate a complete code combination, rather than to an incorrect code combination. This is notably important for the timely detection of errors in the equipment.

Figure 4:
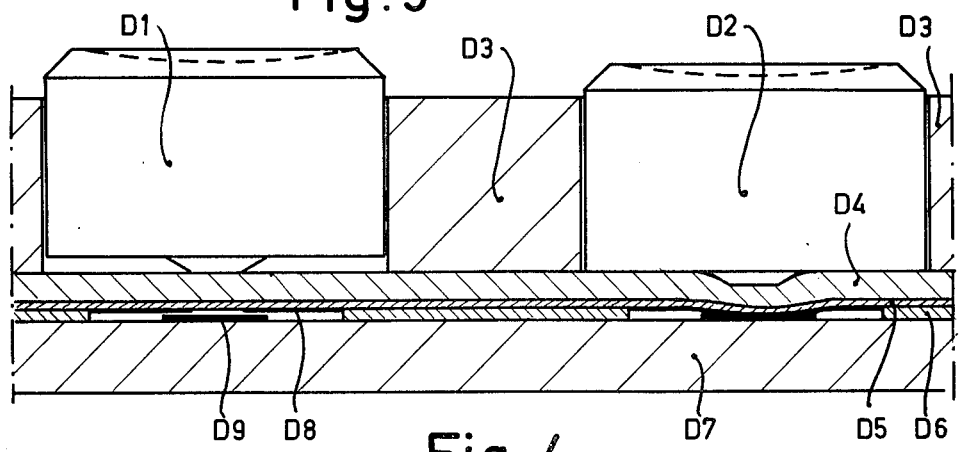
FIG. 4 shows a feasible construction of a key to be used.

FIG. 4 shows an embodiment of a very simple key for use in a keyboard according to the invention. Two keys are shown: D1 in the non-actuated condition, and D2 in the actuated condition. The keys are accommodated in a housing D3 and bear on a layer D4 of silicon rubber in a resilient manner. When a key is depressed (D2), this layer is distorted such that the foil D5 and the contact surfaces D8 provided thereon (like printed wiring) contact the contact faces D9 of the lower layer D7. The layer D6 ensures spacing in the rest condition. Other keys can similarly be used.

What is claimed is:

1. A keyboard comprising a plurality of key elements, signal connection lines, a plurality of contact points for each of said key elements, each of said contact points including a drive contact point, wherein said contact points may be coupled to each other by means of an actuated key, said contact points of different ones of said key elements being selectively connected to each other by said signal connection lines for the transport of a drive contact signal, wherein for a predetermined number of correspondingly constructed key elements, said predetermined number being equal to the product, $n \times m \times p$, of three non-negative integers, there are provided $n + m + p$ signal connection lines, each signal connection line of a group of $n$, $m$, and $p$ signal connections, respectively, being selectively connected to a corresponding contact point of at most $m \times p$, at most $n \times p$, and at most $m \times n$, key elements, respectively, each key element being connected to a single signal connection line of each of the groups of $n$, $m$ and $p$ signal connections, wherein $n$, $m$ and $p$ are predetermined non-negative integers.

2. A keyboard as claimed in claim 1, wherein said keyboard forms part of a series of $q$ keyboards which are arranged together, each said contact points being selectively connected to a one of said signal connections lines of a group of $q$ of said signal connection lines, where $q$ is a positive integer.

3. A keyboard as claimed in claim 1 wherein said key elements are arranged in rows and columns, wherein all of said keys of at least two of said rows have one contact connected to one of said $m$ signal connection lines, and all of said keys of at least two columns have one contact connected to one of said $n$ signal connection lines.

4. A keyboard as claimed in claim 1, further comprising an interrogation device having $m$ outputs which are alternately connected to one of said $m$ signal connections and are individually, interrogated, for each one of said keys each time one of said $m$ signal connections is connected to a drive contact point.

* * * * *